United States Patent [19]

Shuskus

[11] Patent Number: 4,546,372

[45] Date of Patent: Oct. 8, 1985

[54] PHOSPHOROUS-NITROGEN BASED GLASSES FOR THE PASSIVATION OF III-V SEMICONDUCTOR MATERIALS

[75] Inventor: Alexander J. Shuskus, West Hartford, Conn.

[73] Assignee: United Technologies Corporation, Hartford, Conn.

[21] Appl. No.: 484,082

[22] Filed: Apr. 11, 1983

[51] Int. Cl.[4] .................. H01L 27/24; H01L 29/78; H01L 29/161; H01L 29/34

[52] U.S. Cl. ........................... 357/52; 357/2; 357/23.15; 357/61; 357/73; 501/40

[58] Field of Search .............. 357/2, 4, 23 I, 52, 357/61, 73; 501/40

[56] References Cited

U.S. PATENT DOCUMENTS

| | | | |
|---|---|---|---|
| 2,952,599 | 9/1960 | Suchet | 204/177 |
| 3,424,661 | 1/1969 | Androshuk et al. | 204/164 |
| 3,549,411 | 12/1970 | Bean et al. | 117/69 |
| 3,931,039 | 1/1976 | Yamashita et al. | 252/184 |
| 4,172,906 | 10/1979 | Pancholy | 427/82 |
| 4,223,048 | 9/1980 | Engle, Jr. | 427/39 |
| 4,226,898 | 10/1980 | Ovshinsky et al. | 427/39 |
| 4,279,723 | 7/1981 | Osada et al. | 204/164 |
| 4,289,539 | 9/1981 | Li | 106/286.8 |
| 4,453,174 | 6/1984 | Kawasaki et al. | 357/41 |

OTHER PUBLICATIONS

Miller and Shaw, *Phosphorus-Nitrogen Compounds, Part III-Phosphams*, Jrnl of Chem. Soc., Jun., 1963, p. 3233.
Vebrek and Roos, *Dielectric Properties of Phosphorus Nitride Films*, Jrnl of Chem. Solids, 1976, vol. 37, p. 554.
Vebrek, Iqbal, Brunner and Scharli, *Preparation and Properties of Amorphous Nitride Prepared in a Low-Pressure Plasma*, Philosophical Magazine B, 1981, vol. 43, No. 3, 527–547.

*Primary Examiner*—Andrew J. James
*Assistant Examiner*—J. Carroll
*Attorney, Agent, or Firm*—Alan C. Cohen

[57] ABSTRACT

A semiconductor article having a phosphorous nitrogen passivating film thereon. Particularly, an insulated gate field effect transistor device operating in the inversion mode, wherein the device comprises an essentially oxygen-free, amorphous, phosphorous-nitrogen glass passivating film deposited on a III-V semiconductor material.

3 Claims, 4 Drawing Figures

PHOSPHOROUS-NITROGEN BASED GLASSES FOR THE PASSIVATION OF III-V SEMICONDUCTOR MATERIALS

CROSS REFERENCE TO RELATED APPLICATION

This application relates to U.S. application Ser. No. 493,181, filed May 10, 1983 by Melvyn E. Cowher and Alexander J. Shuskus for A METHOD FOR THE FORMATION OF PHOSPHOROUS-NITROGEN BASED GLASSES USEFUL FOR THE PASSIVATION OF III-V SEMICONDUCTOR MATERIALS now U.S. Pat. No. 4,443,489.

TECHNICAL FIELD

The field of art to which this invention pertains is films of phosphorous-nitrogen glasses particularly useful as passivating materials for III-V semiconductor materials.

BACKGROUND ART

III-V type semiconductors are compounds such as GaAs, InSb, InP, InAs and $In_xGa_{x-1}As$, where In and Ga are in Group III in the periodic Table and As, Sb and P are in Group V. These materials have been under investigation by the semiconductor industry for many years. The physical properties of some of these materials, particularly gallium arsenide, show them to be superior to silicon for certain applications. Properties such as larger band-gap energy, along with higher electron mobility and larger electron saturation drift velocities means faster device operations. One particularly attractive application for these III-V materials is in insulated gate field effect transistors operating in the inversion mode (IGFET).

An insulating gate field effect transistor operating in the inversion mode operates on the principle that when a bias voltage is applied to the insulated gate (a dielectric material), the potential alters the surface potential of the semiconductor material, creating an inversion layer.

The inversion layer is created by the effect the potential on the gate (shown as 14 in FIG. 4) has on the position of the valance and conduction bands located at the surface of the semiconductor relative to the position of the energy bands in the bulk. Essentially, this potential bends these bands near the interface surface of the semiconductor and the insulated gate, toward or away from the Fermi level depending on the charge on the gate and whether the semiconductor material is p- or n-type. In p-type gallium arsenide, when a positive bias is applied to the gate, the conduction band is shifted toward the Fermi level resulting in the generation of electrons populating the conduction band. Under this condition, the near surface of the p-type semiconductor is inverted to n-type. This inversion results in an excess of electrons in a layer between the source (shown as 15 in FIG. 4) and the drain (shown as 16 in FIG. 4). These electrons, the quantity of which is dependent on the gate potential, are available for conduction. As a result, a controllable electro-conduction path exists between the source and the drain, which permits the transistor to function.

The basic problem in applying III-V semiconductor materials to an IGFET, has been the difficulty in finding a passivating material which does not result in a high surface state density, thereby pinning the Fermi level near mid-gap and creating a condition which prevents inversion from taking place. It was determined some time ago that the presence of oxygen at the interface results in the generation of a high density of extrinsic surface states. Therefore, an assessment of the suitability of an alternate dielectric for the passivation of III-V semiconductor surfaces is dependent on a material which is substantially, oxygen free and which will permit deposition of this dielectric without the formation of an intervening interfacial oxide layer. Additionally, such material must have good electrical and themal stability and be chemically inert.

The availability of an effective, stable passivating material, in particular one which will allow the production of insulated gate field effect transistors operating in the inversion mode, would have a significant impact in the III-V semiconductor device industry. In particular, it would open the way for the fabrication of these IGFETS which are necessary components for implementing III-V semiconductor large scale integration (LSI) high speed digital circuits.

DISCLOSURE OF INVENTION

This application is directed toward substantially oxygen free, amorphous phosphorous-nitrogen glasses, particularly phospham, to III-V semiconductor materials for use as a passivating material for production of the gate in IGFETS, operating in the inversion mode is disclosed herein.

The foregoing and other features and advantages of the present invention, will become more apparent from the following description and accompanying drawings.

BEST MODE FOR CARRYING OUT THE INVENTION

A phosphorous nitrogen glass film comprising a plurality of ($PN_2H$) repeating units was selected as the passivating material and gallium arsenide was chosen as the III-V semiconductor material. The passivation material which was chosen is called phosham and although this material has been known for many years, it has only been known as an infusible, white powder which is stable in air and insoluble in acids and alkalies. For this application, the material has been synthesized as an amorphous, glass-like film.

Figure 1:
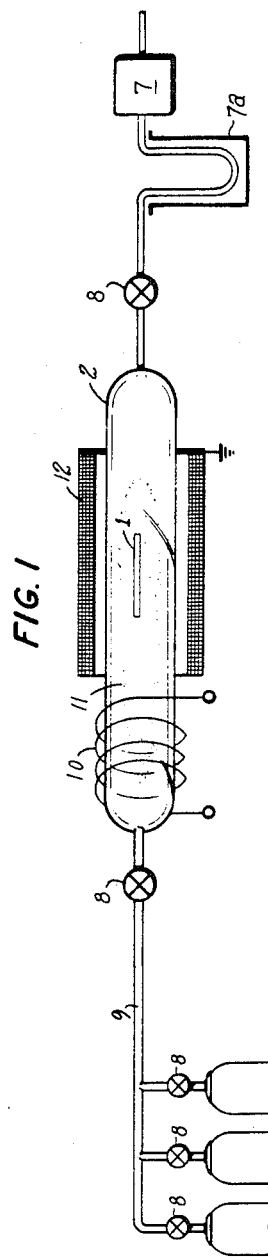
FIG. 1 is a schematic illustration of an apparatus which can be used to produce the surface passivating coating of the present invention.

A phospham film of this type may be applied to a III-V semiconductor using an apparatus as schematically illustrated in FIG. 1. The apparatus is meant to be exemplary and illustrative rather than limiting. Referring now to FIG. 1, the III-V compound 1 to be passivated is located within an evacuated chamber 2. The three gases, phosphine 3 ($PH_3$), nitrogen 4 and hydrogen 5 are introduced to the evacuated chamber in the proportion of approximately 0.15:3:1 by pressure and continue to flow through the chamber during the passivation process. The three gases are fed into a common duct 9 where they are mixed together. Using vacuum pumps 7, a liquid nitrogen cold trap 7a and appropriate valving 8, the chamber is maintained at the appropriate low pressure. The mixed gases then flow into the chamber where they pass through a part of the chamber surrounded by an RF induction coil 10. When the coil is energized the gases are converted into a plasma 11. The plasma extends some distance from the coil and the sample to be passivated is placed within the plasma zone. This plasma zone may be determined by placing a quartz rod inside the chamber and operating the system as usual. The rod, which should extend from the proximal end of the coil to the end of the chamber distal from the coil, will be coated with a deposit of phospham in the appropriate area. A grounded metal screen 12 is placed around the chamber where the sample is positioned to insure uniform and stochiometric film deposition.

Other phosphorous-nitrogen glasses may be formed by varying the position of the semiconductor material witin the plasma zone, one of these is $(P_3N_5)_x$.

EXAMPLE

A phospham glass insulated gate was deposited on the gallium arsenide substrate as follows:

A sample of gallium arsenide approximately 2 cm by 2 cm, was placed in a two-inch quartz tube, such that the sample was properly positioned within the plasma zone. The plasma zone was determined by placing a quartz rod in the reactor tube, operating the apparatus, and nothing where on the quartz tube the phospham is deposited.

Surrounding the tube adjacent to the susceptor was a 6 turn coil which was connected to a 500 watt, 13.5 MHz RF source. The reactor tube was evacuated to less than $10^{-6}$ torr and purged with high purity, dry hydrogen. The hydrogen gas was then set at a reduced pressure of 0.50 torr while the RF coil was operating creating an $H_2$ plasma. This plasma was brought in contact with the sample raising the temperature of the sample to 270° C. and etching away surface oxides on the GaAs substrate. Phosphine and nitrogen were simultaneously introduced to the reactor tube at reduced pressures of 0.075 torr and 1.5 torr respectively, along with the hydrogen. Under these conditions the phospham film was deposited at the rate of approximately 220 A°/min.

Figure 3:
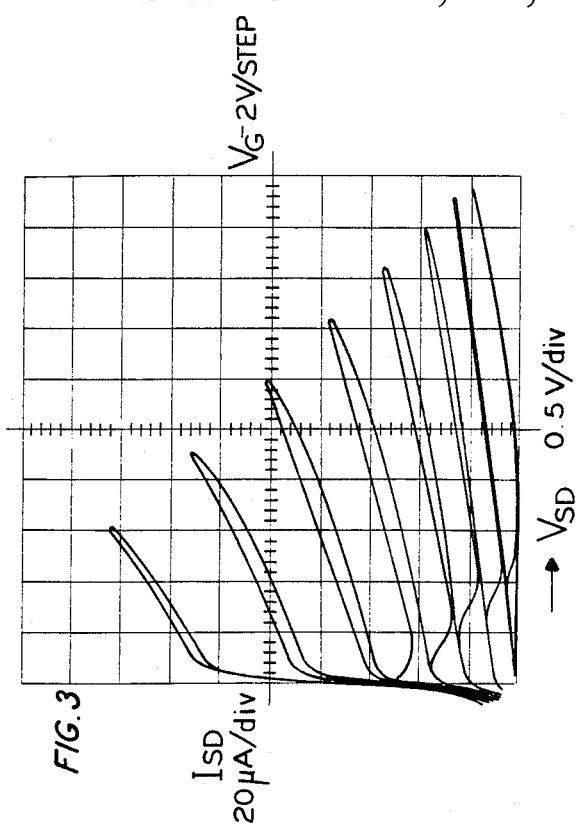
FIG. 3 is a plot showing the increase in current flow when the voltage to the gate is increased in a phospham passivated III-V semiconductor field effect transistor.
Figure 4:
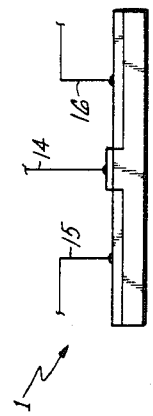
FIG. 4 is a schematic of an IGFET designed to operate in the inversion mode.
Figure 2:
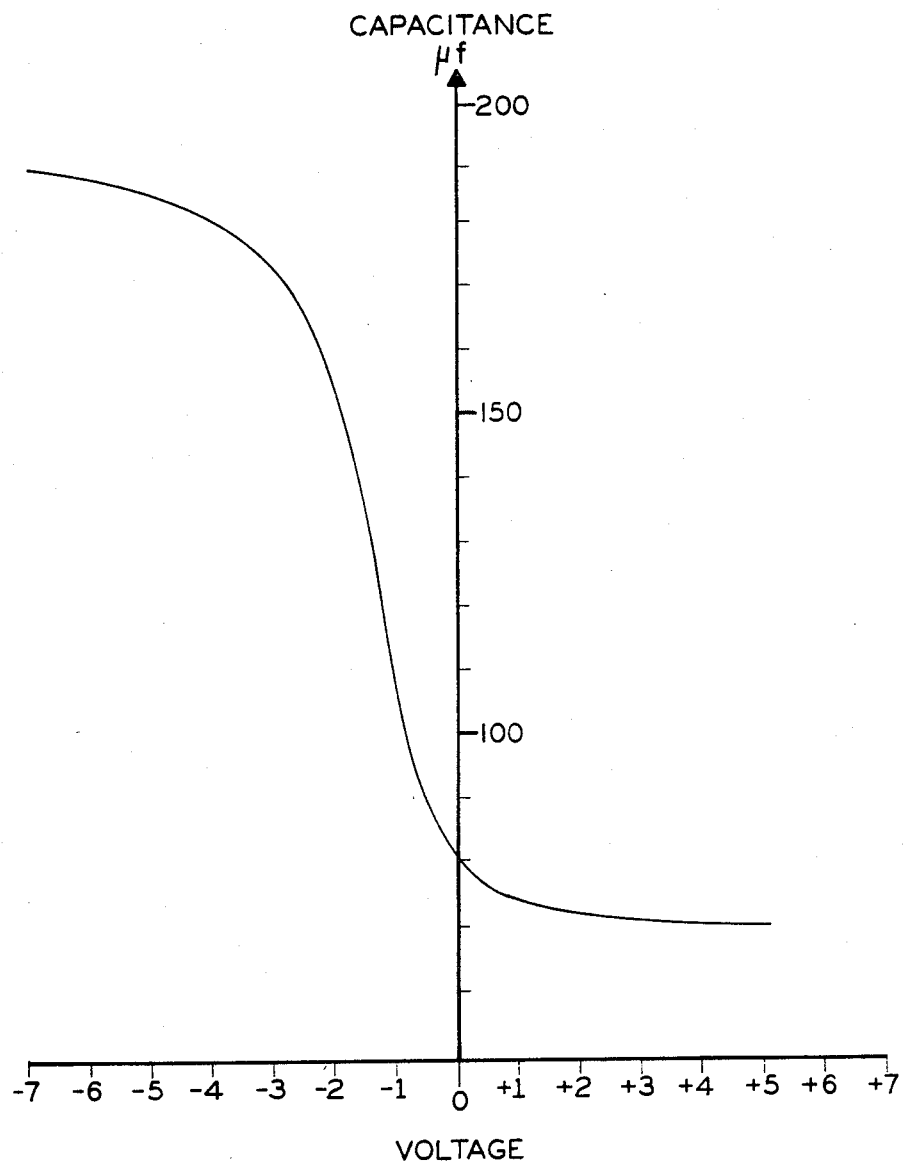
FIG. 2 is a plot of capacitance versus applied voltage for gallium arsenide, passivated with the present invention illustrating surface inversion.

When the thickness reached approximately 1000 A°, the passivated semiconductor samples were removed and insulated gate field effect transistors and test capacitors were formed using aluminum as the gate contacting material. These devices were annealed at 300° C. in a hydrogen atmosphere for 1 hour. Initially, capacitance-voltage measurements were carried out to determine if the capacitance-voltage (C-V) characteristics were consistent with inversion. FIG. 2 shows a typical C-V characteristic graph obtained and the occurrence of surface inversion is strongly implied by the data. FIG. 3 shows the current voltage characteristics of an insulated gate field effect transistor as a function of gate bias for a p-channel device and clearly shows that inversion is achieved.

III-V semiconductor materials have been greatly limited in electronic applications due to the inability, to date, to adequately passivate the surfaces. By applying these phosphorous-nitrogen base glasses as protective, passivating materials, this problem is solved allowing these compounds to be used in devices such as IGFETS, as well as a conventional protective passivating medium. Glasses such as $P_3N_5$ and phospham will provide excellent protection for the surface of semiconductors against attack from moisture, acids and alkalies. Additionally, these glasses will allow the semiconductor industry to use these III-V materials in new applications where their unique properties, such as increased electron mobility, can be taken advantage of.

Although the invention has been shown and described with respect to preferred embodiments thereof, it should be understood by those skilled in the art that various changes and omissions in the form and detail thereof may be made therein without departing from the spirit and the scope of the invention.

Having thus described our invention that which we claim as new and desire to secure by Letters Patent of the United States is:

1. A III-V semiconductor material having a passivating layer of substantially oxygen-free, amorphous phospham glass thereon.

2. An insulated gate field effect transistor capable of operating in the inversion mode comprising a III-V semiconductor material having a gate of substantially oxygen-free, amorphous phospham glass.

3. The insulated gate field effect transistor of claim 2 wherein the semiconductor material is gallium arsenide.

* * * * *